US012709793B2

(12) United States Patent
Ahn et al.

(10) Patent No.: US 12,709,793 B2
(45) Date of Patent: Aug. 18, 2026

(54) APPARATUS FOR MANUFACTURING DISPLAY DEVICE

(71) Applicant: Samsung Display Co., Ltd., Yongin-si (KR)

(72) Inventors: Junghyun Ahn, Yongin-si (KR); Jaesuk Moon, Yongin-si (KR); Seungjin Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 457 days.

(21) Appl. No.: 18/508,606

(22) Filed: Nov. 14, 2023

(65) Prior Publication Data

US 2024/0318296 A1 Sep. 26, 2024

(30) Foreign Application Priority Data

Mar. 24, 2023 (KR) ........................ 10-2023-0039231
Jun. 8, 2023 (KR) ........................ 10-2023-0073726

(51) Int. Cl.
*C23C 14/04* (2006.01)
*H10K 71/16* (2023.01)

(52) U.S. Cl.
CPC ......... *C23C 14/042* (2013.01); *H10K 71/166* (2023.02)

(58) Field of Classification Search
CPC ............................ C23C 14/042; H10K 71/166
See application file for complete search history.

(56) References Cited

U.S. PATENT DOCUMENTS

| | | | |
|---|---|---|---|
| 5,996,218 | A | 12/1999 | Shamouilian et al. |
| 6,483,690 | B1 | 11/2002 | Nakajima et al. |
| 10,581,025 | B2 | 3/2020 | Ryu et al. |
| 2020/0219740 | A1 | 7/2020 | Oohashi |

FOREIGN PATENT DOCUMENTS

| | | | |
|---|---|---|---|
| JP | 3693388 | 9/2005 | |
| KR | 10-0916953 | 9/2009 | |
| KR | 10-1066798 | 9/2011 | |
| KR | 10-2017-0103089 | 9/2017 | |
| KR | 10-1907728 | 10/2018 | |
| KR | 10/2021570 | 9/2019 | |
| KR | 10-2073920 | 2/2020 | |
| WO | WO-2017198298 A1 * | 11/2017 | ........... C23C 14/042 |

* cited by examiner

*Primary Examiner* — Xiao S Zhao
(74) *Attorney, Agent, or Firm* — CANTOR COLBURN LLP

(57) ABSTRACT

An apparatus for manufacturing a display device includes a chamber, a mask assembly arranged inside the chamber and facing a display substrate, an electrostatic chuck arranged inside the chamber, making the display substrate to be in close contact with the mask assembly, and including a plurality of magnetic members, and a magnetic force unit arranged inside the chamber and comprising a plurality of magnet units that apply magnetic force to the mask assembly. Each of the plurality of magnet units extends in a first direction and are arranged to be spaced apart from each other in a second direction intersecting the first direction, and each of the plurality of magnetic members has a side overlapping at least one of the plurality of magnet units and another side overlapping an opening between two adjacent ones of the plurality of magnet units in a plan view.

20 Claims, 14 Drawing Sheets

APPARATUS FOR MANUFACTURING DISPLAY DEVICE

CROSS-REFERENCE TO RELATED APPLICATION(S)

This application claims priority to and benefits of Korean Patent Application Nos. 10-2023-0039231, filed on Mar. 24, 2023, and 10-2023-0073726, filed on Jun. 8, 2023, under 35 U.S.C. § 119, in the Korean Intellectual Property Office (KIPO), the entire contents of which are incorporated herein by reference.

BACKGROUND

1. Field

Embodiments relate to an apparatus for manufacturing a display device.

2. Description of the Related Art

Recently, electronic devices have been widely used. Electronic devices are used in various ways, such as mobile electronic devices and fixed electronic devices, and electronic devices include a display device capable of providing a user with visual information, such as images or videos, to support various functions.

A display device is a device that visually displays data, and is formed by depositing various layers, such as an organic layer and a metal layer. A deposition material may be deposited to form a plurality of layers of a display device. For example, the deposition material is sprayed from a deposition source and deposited on a substrate through a mask assembly. In case that the shape of a mask sheet is changed or an interference phenomenon occurs between the mask sheet and a shielding stick, the deposition material may not be deposited at a required position on the substrate, and thus, deposition quality may be reduced.

The above-mentioned background art is technical information that the inventor possesses for deriving the disclosure or obtains in the process of deriving the disclosure, and is not necessarily a technology disclosed to the general public prior to the filing of the disclosure.

SUMMARY

Embodiments relate to an apparatus for manufacturing a display device, wherein the apparatus is configured to control magnetic force acting between a magnetic force unit and a mask sheet by arranging a separate magnetic member on an electrostatic chuck.

However, these objectives are examples, and the scope of the disclosure is not limited thereto.

Additional aspects will be set forth in part in the description which follows and, in part, will be apparent from the description, or may be learned by practice of the presented embodiments of the disclosure.

According to an embodiment, an apparatus for manufacturing a display device may include a chamber, a mask assembly arranged inside the chamber and facing a display substrate, an electrostatic chuck arranged inside the chamber, making the display substrate to be in close contact with the mask assembly, and including a plurality of magnetic members, and a magnetic force unit arranged inside the chamber and including a plurality of magnet units that apply magnetic force to the mask assembly. Each of the plurality of magnet units may extend in a first direction and may be arranged to be spaced apart from each other in a second direction intersecting the first direction, and each of the plurality of magnetic members may have a side overlapping at least one of the plurality of magnet units and another side overlapping an opening between two adjacent ones of the plurality of magnet units in a plan view.

In an embodiment, in a cross-sectional view, each of the plurality of magnetic members may be arranged to be spaced apart from a center line of each of the plurality of magnet units, and the center line of each of the plurality of magnet units may be based on the second direction.

In an embodiment, the electrostatic chuck may include a first electrostatic layer including an insulating material, an electrostatic electrode arranged in the first electrostatic layer and including a plurality of positive electrodes and a plurality of negative electrodes, and a second electrostatic layer disposed on the first electrostatic layer. The plurality of magnetic members may be arranged in the second electrostatic layer.

In an embodiment, the plurality of magnetic members may be arranged to be spaced apart from the first electrostatic layer.

In an embodiment, the plurality of magnetic members may contact the first electrostatic layer.

In an embodiment, a thickness of the second electrostatic layer may be greater than a thickness of the first electrostatic layer in a thickness direction of the magnetic force unit.

In an embodiment, the second electrostatic layer may include at least one of ceramic, aluminum, titanium, stainless steel, and yttrium oxide.

In an embodiment, the mask assembly may include a mask frame including a mask opening, and a plurality of mask sheets fixed to the mask frame and overlapping the mask opening in a plan view.

In an embodiment, each of the plurality of mask sheets may extend in the second direction.

In an embodiment, each of the plurality of magnetic members may extend in the first direction.

According to an embodiment, an apparatus for manufacturing a display device may include a mask assembly arranged inside a chamber and facing a display substrate, an electrostatic chuck arranged inside the chamber and making the display substrate to be in close contact with the mask assembly, and a magnetic force unit arranged inside the chamber and including a first magnet unit and a second magnet unit that apply magnetic force to the mask assembly. The electrostatic chuck may include a first magnetic member, a second magnetic member, a third magnetic member, and a fourth magnetic member each extending in a first direction and arranged to be spaced apart from each other in a second direction intersecting the first direction, a side of each of the first magnetic member and the second magnetic member may overlap the first magnet unit in a plan view, a side of each of the third magnetic member and the fourth magnetic member may overlap the second magnet unit in a plan view, and another side of each of the second magnetic member and the third magnetic member may overlap an opening between the first magnet unit and the second magnet unit in a plan view.

In an embodiment, in a cross-sectional view, each of the first magnetic member and the second magnetic member may be arranged to be spaced apart from a center line of the first magnet unit, each of the third magnetic member and the fourth magnetic member may be arranged to be spaced apart from a center line of the second magnet unit, and the center line of the first magnet unit and the center line of the second magnet unit may be based on the second direction.

In an embodiment, the electrostatic chuck may further include a first electrostatic layer including an insulating material, an electrostatic electrode arranged in the first electrostatic layer and including a plurality of positive electrodes and a plurality of negative electrodes, and a second electrostatic layer disposed on the first electrostatic layer. The first magnetic member, the second magnetic member, the third magnetic member, and the fourth magnetic member may be arranged in the second electrostatic layer.

In an embodiment, the first magnetic member, the second magnetic member, the third magnetic member, and the fourth magnetic member may be arranged to be spaced apart from the first electrostatic layer.

In an embodiment, the first magnetic member, the second magnetic member, the third magnetic member, and the fourth magnetic member may contact the first electrostatic layer.

In an embodiment, a thickness of the second electrostatic layer may be greater than a thickness of the first electrostatic layer in a thickness direction of the magnetic force unit.

In an embodiment, the second electrostatic layer may include at least one of ceramic, aluminum, titanium, stainless steel, and yttrium oxide.

In an embodiment, the mask assembly may include a mask frame including a mask opening, and a plurality of mask sheets fixed to the mask frame and overlapping the mask opening in a plan view.

In an embodiment, each of the plurality of mask sheets may extend in the second direction.

In an embodiment, the apparatus may further include a deposition source arranged inside the chamber and accommodating a deposition material.

Other aspects, features, and advantages other than those described above will now become apparent from the following drawings, claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
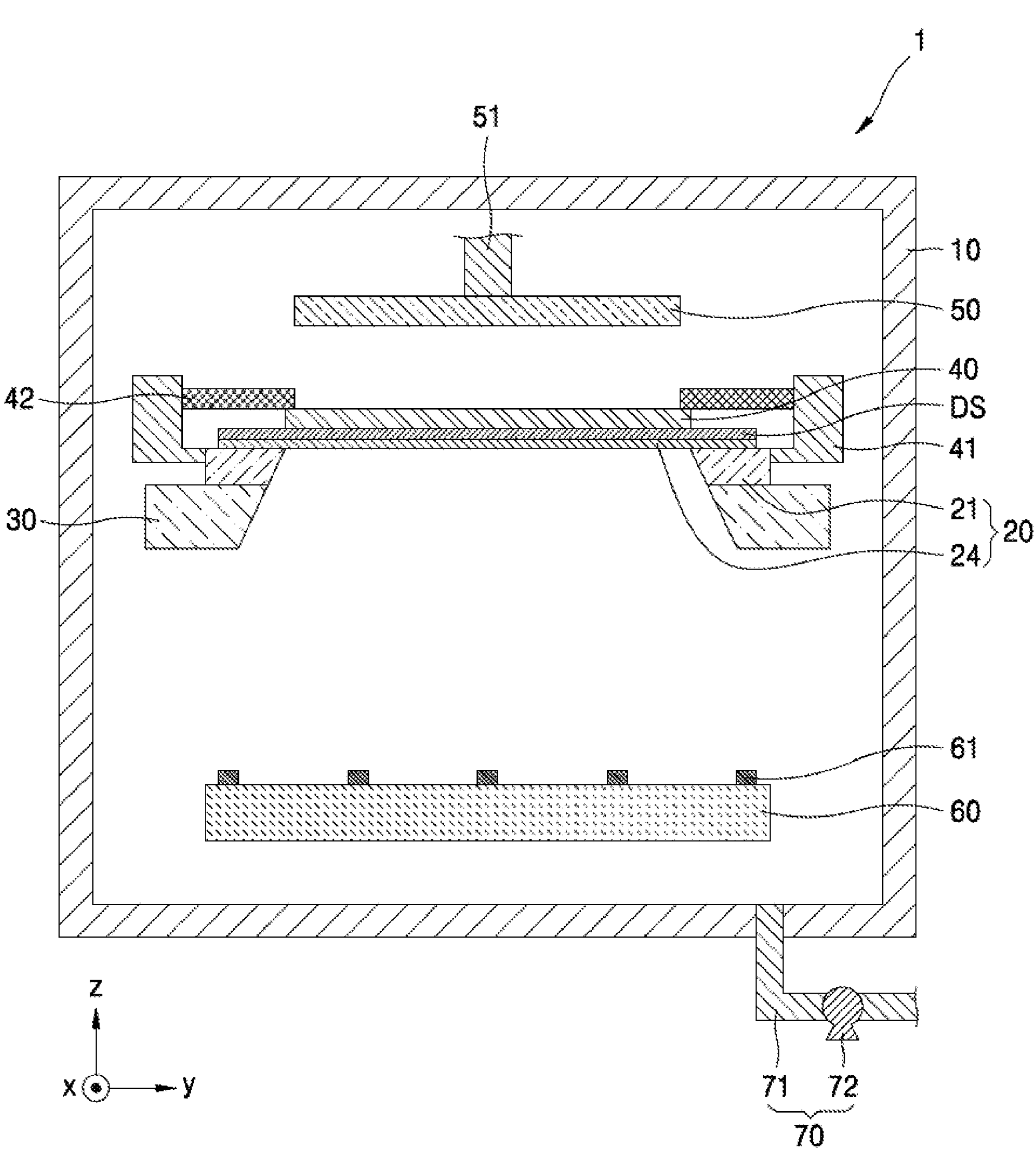
FIG. 1 is a schematic cross-sectional view illustrating an apparatus for manufacturing a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will not be repeated.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the disclosure, and are not intended to preclude the possibility that one or more other features or elements may exist or may be added.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Sizes of elements in the drawings may be exaggerated for convenience of explanation. In other words, since sizes and thicknesses of components in the drawings are arbitrarily illustrated for convenience of explanation, the following embodiments are not limited thereto.

The x-axis, the y-axis, and the z-axis are not limited to three axes on the orthogonal coordinates system, and may be interpreted in a broad sense including the same. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic cross-sectional view illustrating an apparatus for manufacturing a display device according to an embodiment.

Referring to FIG. 1, an apparatus 1 for manufacturing a display device may include a chamber 10, a mask assembly 20, a support member 30, an electrostatic chuck 40, a first driver 41, a magnetic force unit 50, and a second driver 51.

The chamber 10 may have a space formed therein. Although not illustrated in FIG. 1, the chamber 10 may be formed to have a portion open, and a gate valve or the like may be arranged at the open portion of the chamber 10 to open or shied the open portion of the chamber 10.

The apparatus 1 for manufacturing a display device according to an embodiment may include the support member 30. The support member 30 may support the mask assembly 20. The support member 30 may fix the mask assembly 20. Also, the support member 30 may move the mask assembly 20 up and down within a distance range or may rotate the mask assembly 20 within an angular range. The support member 30 may also linearly move the mask assembly 20 in various directions within a distance range.

The mask assembly 20 may be arranged inside the chamber 10 to face a display substrate DS. The mask assembly 20 may include a mask frame 21, a shielding stick 22 (refer to FIG. 2), a support stick 23 (refer to FIG. 2), and a mask sheet 24. The shielding stick 22 (refer to FIG. 2) and the support stick 23 (refer to FIG. 2) are described in detail below with reference to FIG. 2.

A mask opening OP21 (refer to FIG. 2) through which a deposition material may pass may be arranged in the mask frame 21. The mask sheet 24 may be fixed to the mask frame 21 to overlap the mask opening OP21 in a plan view.

The display substrate DS on which a deposition material is deposited may be disposed on the mask assembly 20. The electrostatic chuck 40 may be disposed on the display substrate DS. The electrostatic chuck 40 may be arranged inside the chamber 10. The electrostatic chuck 40 may fix the display substrate DS by using electrostatic force and adhere the display substrate DS to the mask sheet 24. The electrostatic chuck 40 may be coupled to the display substrate DS to align with the display substrate DS, and may prevent the display substrate DS from moving during deposition of a deposition material. Also, the electrostatic chuck 40 may prevent gas filled between the electrostatic chuck 40 and the display substrate DS from leaking out and prevent the display substrate DS from being lifted by the gas.

The first driver 41 may drive the electrostatic chuck 40. For example, the first driver 41 may be connected to the electrostatic chuck 40 by a connection member 42 to drive the electrostatic chuck 40. The first driver 41 may transfer the electrostatic chuck 40 upward or downward. Also, the first driver 41 may rotate the electrostatic chuck 40 within an angular range, and may linearly move the electrostatic chuck 40 in various directions within a distance range. For example, the first driver 41 may include a device or structure, such as a motor, a cylinder, or the like.

The magnetic force unit 50 may be arranged inside the chamber 10 to overlap the electrostatic chuck 40 in a plan view. By arranging the magnetic force unit 50 to overlap the electrostatic chuck 40, the display substrate DS may closely contact the mask sheet 24 by electrostatic force and magnetic force. The display substrate DS and the mask sheet 24 may be prevented from sagging by using the magnetic force unit 50 to pull the mask sheet 24 containing metal by magnetic force.

The second driver 51 may drive the magnetic force unit 50. The second driver 51 may move the magnetic force unit 50 upward or downward. Also, the second driver 51 may rotate the magnetic force unit 50 within an angular range, and may linearly move the magnetic force unit 50 in various directions within a distance range. For example, the second driver 51 may include a device or structure, such as a motor, a cylinder, or the like.

In an embodiment, the electrostatic chuck 40 and the magnetic force unit 50 may be driven independently of each other. For example, the electrostatic chuck 40 may be driven by the first driver 41, and the magnetic force unit 50 is driven by the second driver 51, and thus the electrostatic chuck 40 and the magnetic force unit 50 may be driven independently of each other. As the electrostatic chuck 40 and the magnetic force unit 50 are independently driven by different drivers, misalignment due to vibration may be prevented, and production capacity may be improved.

The apparatus 1 for manufacturing a display device according to an embodiment may further include a deposition source 60. The deposition source 60 may be arranged inside the chamber 10. A deposition material may be accommodated inside the deposition source 60. The deposition source 60 may include a heater that heats the deposition material.

A nozzle unit 61 may be connected to the deposition source 60 to guide the deposition material vaporized or sublimated in the deposition source 60 to the outside. The nozzle unit 61 may include one or more nozzles. The one or more nozzles may be arranged to be spaced apart from each other, and may be in the form of dot nozzles arranged in a dotted shape. In another embodiment, the nozzles may be in the form of a line spraying a deposition material to a region.

A pressure adjusting unit 70 may be connected to the chamber 10 to adjust the pressure inside the chamber 10. The pressure adjusting unit 70 may include a connection pipe 71 connected to the chamber 10 and a pump 72 arranged in the connection pipe 71. The connection pipe 71 may be connected to a separate device capable of removing external contaminants.

Figure 2:
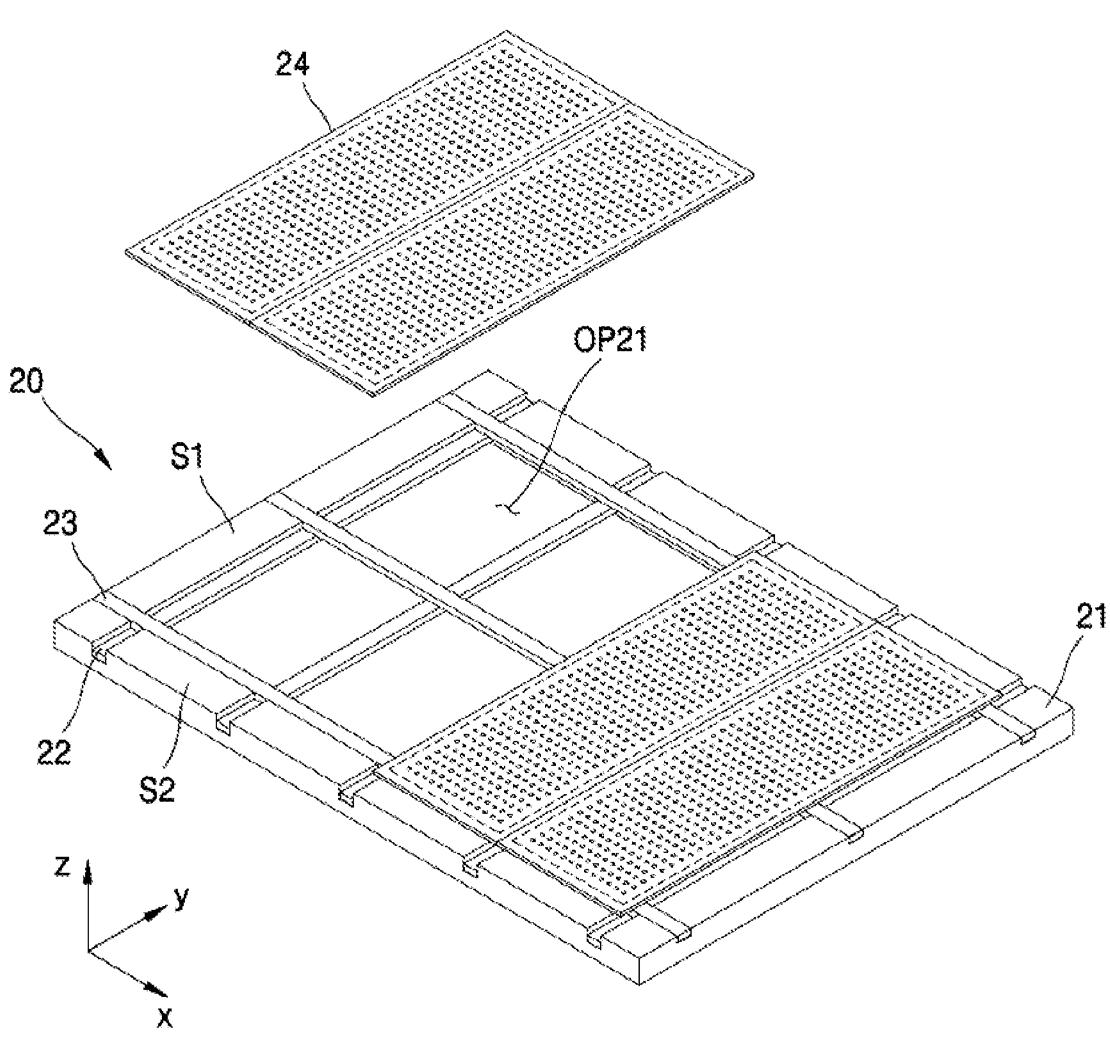
FIG. 2 is a schematic perspective view of a mask assembly according to an embodiment.

FIG. 2 is a schematic perspective view of a mask assembly according to an embodiment.

Referring to FIG. 2, the mask assembly 20 may include the mask frame 21, the shielding stick 22, the support stick 23, and the mask sheet 24.

The mask frame 21 may be formed by connecting multiple sides, and may include the mask opening OP21 defined by the sides. For example, the mask opening OP21 may be formed by the surrounding sides, and the mask opening OP21 may be formed through the center of the mask frame 21.

The mask frame 21 may be a rectangular frame in an embodiment. However, the shape of the mask frame 21 is not limited thereto and may be a polygonal shape of various shapes. Hereinafter, for convenience of description, an embodiment that the mask frame 21 is a rectangular frame is described.

In case that the mask frame 21 is a rectangular frame, the sides may include a first side S1 extending in a second direction (e.g., a y axis direction), and a second side S2 extending in a first direction (e.g., an x axis direction) intersecting with the second direction. A pair of first sides S1 may be provided to face each other, and a pair of second sides S2 may be provided to face each other, wherein the pair or first sides S1 and the pair of second sides S2 may be connected to each other. In an embodiment, the first side S1 may be a short side, and the second side S2 may be a long side. However, the disclosure is not limited thereto, and the first side S1 may be a long side, and the second side S2 may be a short side, or the first side S1 and the second side S2 may have a same length. Hereinafter, for convenience of description, an embodiment that the first side S1 is a short side, and the second side S2 is a long side, is described.

The shielding stick 22 may be arranged to extend in the second direction (e.g., the y axis direction) and cross the mask opening OP21. For example, grooves for accommodating ends of the shielding stick 22 may be arranged in the mask frame 21. However, the disclosure is not limited thereto, and a separate groove may not be arranged in the mask frame 21, and the shielding stick 22 may be disposed on the mask frame 21. The shielding stick 22 may be arranged to be positioned between multiple mask sheets 24 to shield a space between two adjacent mask frames 24 such that a deposition material may not pass through. Multiple shielding sticks 22 may be provided and arranged to be spaced apart from each other in the first direction (e.g., the x axis direction) and to be parallel to each other.

The support stick 23 may be arranged to extend in the first direction (e.g., the x axis direction) and cross the mask opening OP21. The support stick 23 may intersect the shielding stick 22 at the mask opening OP21 and may be positioned on the shielding stick 22. For example, grooves for accommodating ends of the support stick 23 may be arranged in the mask frame 21. However, the disclosure is not limited thereto, a separate groove may not be arranged in the mask frame 21, and the support stick 23 may be disposed on the mask frame 21. The support stick 23 may prevent the mask sheet 24 from sagging by supporting the mask sheet 24 in the mask opening OP21.

Multiple holes may be arranged in the mask sheet 24 to allow a deposition material to pass therethrough. The mask sheet 24 may be installed in a tensioned state on the mask frame 21. At least a portion of the mask opening OP21 at the center of the mask frame 21 may be covered with the mask sheet 24.

In an embodiment, at least one mask sheet 24 may be provided, and in case that at least two mask sheets 24 are provided, the mask sheets 24 may be disposed on the mask frame 21 to be parallel to each other. For example, the mask sheets 24 may be arranged side-by-side in the first direction (e.g., the x axis direction). Each of the mask sheets 24 may extend long in the second direction (e.g., the y axis direction). For example, ends of the mask sheet 24 may be fixed to the mask frame 21 by a welding method.

Figure 3:
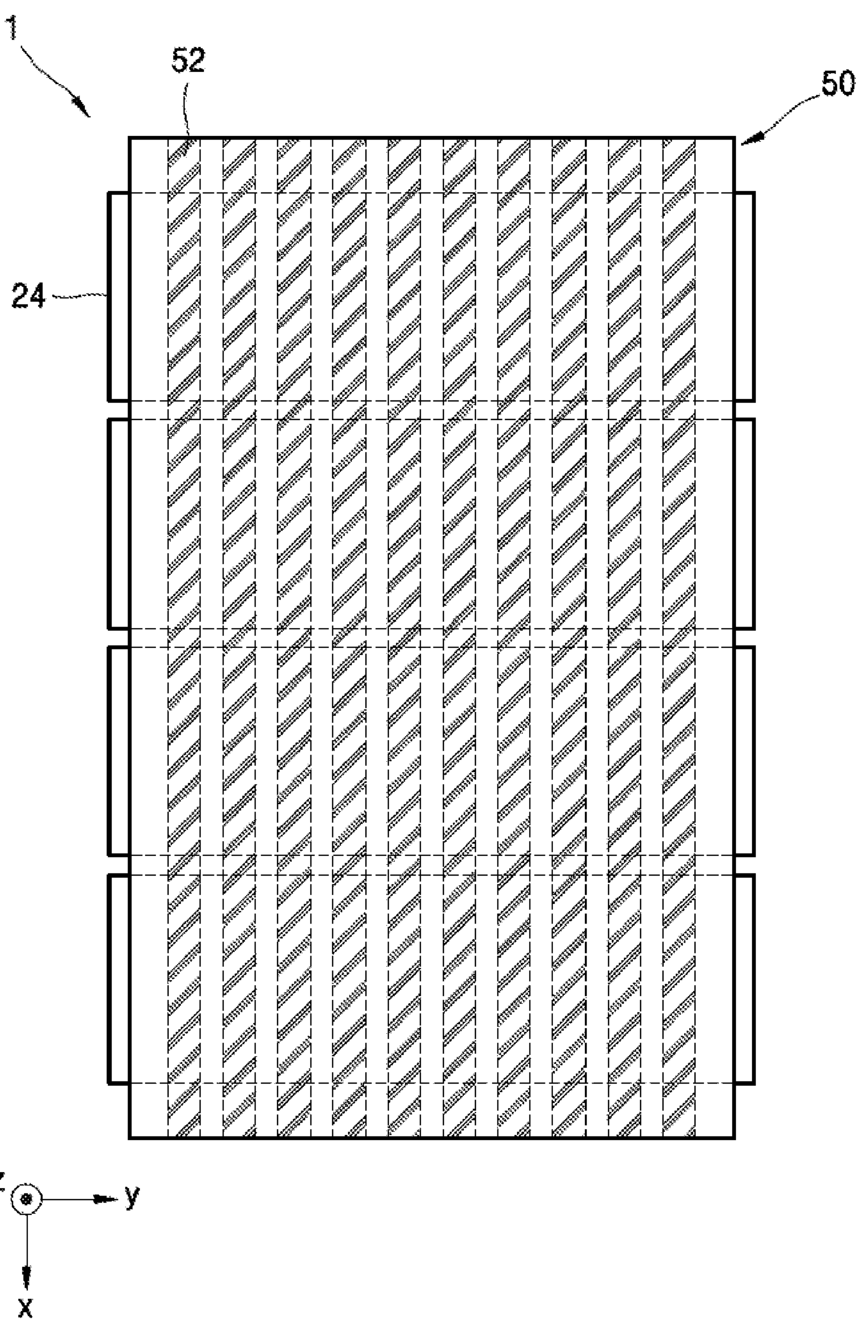
FIG. 3 is a plan view of a portion of an apparatus for manufacturing a display device according to an embodiment.
Figure 4:
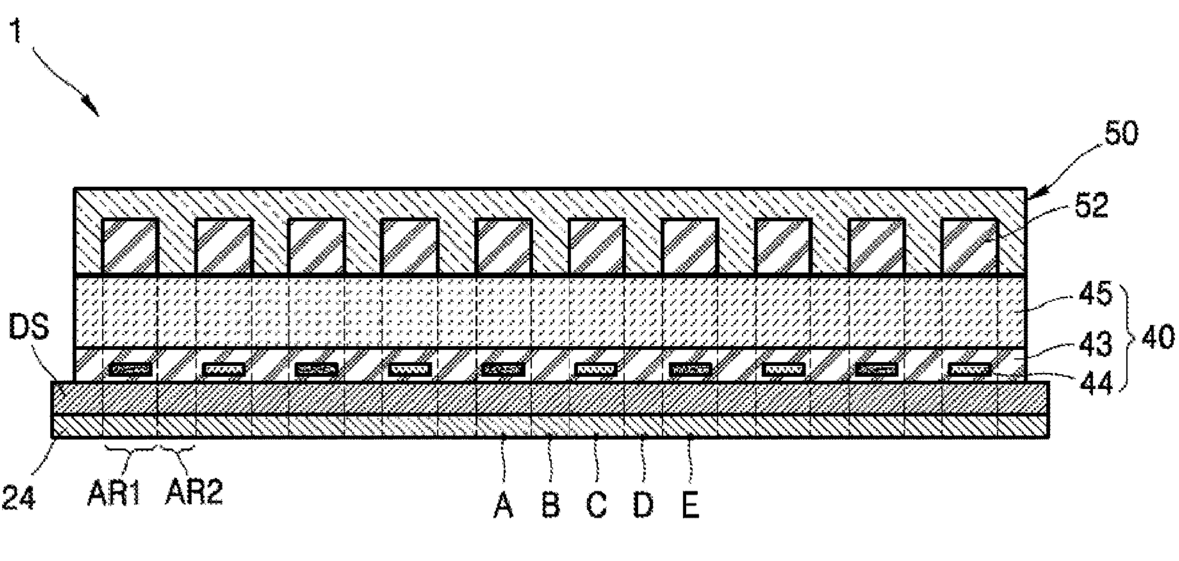
FIG. 4 is a schematic cross-sectional view of a portion of an apparatus for manufacturing a display device according to an embodiment.

FIG. 3 is a plan view of a portion of an apparatus for manufacturing a display device according to an embodiment, and FIG. 4 is a schematic cross-sectional view of a portion of an apparatus for manufacturing a display device according to an embodiment.

For convenience of description, FIG. 3 shows only the mask sheet 24 and the magnetic force unit 50, and FIG. 4 shows only the mask sheet 24, the display substrate DS, the electrostatic chuck 40, and the magnetic force unit 50.

Referring to FIGS. 3 and 4, the magnetic force unit 50 may include multiple magnet units 52 to apply magnetic force to the mask assembly 20 (refer to FIG. 1). The magnet units 52 may apply magnetic force to the mask sheet 24. The magnet units 52 may each extend in the first direction (e.g., the x axis direction). The magnet units 52 may be arranged to be spaced apart from each other in the second direction (e.g., the y axis direction). The magnet units 52 may be arranged to be parallel to each other.

The mask sheet 24 may extend in the second direction (e.g., the y axis direction). In case that multiple mask sheets 24 are provided, the mask sheets 24 may be arranged to be spaced apart from each other in the first direction (e.g., the x axis direction). The mask sheets 24 may be arranged to be parallel to each other. In this structure, in a plan view, a longitudinal direction of the mask sheet 24 may intersect a longitudinal direction of the magnet units 52.

The electrostatic chuck 40 may include a first electrostatic layer 43, an electrostatic electrode 44, and a second electrostatic layer 45.

The first electrostatic layer 43 may include an insulating material. The first electrostatic layer 43 may include yttrium oxide ($Y_2O_3$) and alumina ($Al_2O_3$).

The electrostatic electrode 44 may be arranged in the first electrostatic layer 43, and may include multiple positive electrodes and multiple negative electrodes. The electrostatic electrode 44 may be arranged inside the first electrostatic layer 43. The positive electrodes and the negative electrodes may each extend in the first direction (e.g., the x axis direction), and may be alternately arranged in the second direction (e.g., the y axis direction). For example, one negative electrode may be arranged between two adjacent positive electrodes, and one positive electrode may be arranged between two adjacent negative electrodes.

The positive electrodes and the negative electrodes may have different polarities. For example, the positive electrodes and the negative electrodes may each include at least one of tungsten (W), silver (Ag), and copper (Cu).

A positive direct current voltage may be applied to the positive electrodes, so that a first electrostatic force may be generated between the positive electrodes and a substrate. A negative direct current voltage may be applied to the negative electrodes, so that a second electrostatic force may be generated between the negative electrodes and the substrate.

The electrostatic chuck 40 according to an embodiment may be a bipolar electrostatic chuck. However, the disclosure is not limited thereto, and the type of the electrostatic chuck 40 is not limited thereto. For example, the electrostatic chuck 40 may be a monopolar electrostatic chuck, and direct current voltages having a same polarity may be applied to the positive electrodes and the negative electrodes of the electrostatic chuck 40.

The second electrostatic layer 45 may be disposed on the first electrostatic layer 43. The thickness of the second electrostatic layer 45 may be greater than the thickness of the first electrostatic layer 43. For example, the second electrostatic layer 45 may include at least one of ceramic, aluminum, titanium, stainless steel, and yttrium oxide.

Attractive force according to magnetic force may be applied between the magnet units 52 and the mask sheet 24. External force may act on the mask sheet 24 in a third direction (e.g., +z axis direction) toward the magnet units 52.

The mask sheet 24 may be divided into a first portion AR1 overlapping the magnet units 52 and a second portion AR2 not overlapping the magnet units 52 in a plan view. The second portion AR2 of the mask sheet 24 may overlap an opening between two adjacent magnet units 52 in a plan view.

External force may be applied to the first portion AR1 of the mask sheet 24 in the third direction (e.g., the +z axis direction) by magnetic force formed by the magnet unit 52. As multiple magnet units 52 are provided, multiple first portions AR1 and multiple second portions AR2 may also be provided. As multiple first portions AR1 are provided, magnetic force acting on the mask sheet 24 may not be constant. For example, magnetic force acting on the first portions AR1 may be greater than magnetic force acting on the second portions AR2. Accordingly, the mask sheet 24 may have a wave in the second direction (e.g., the y axis direction).

Figure 5:
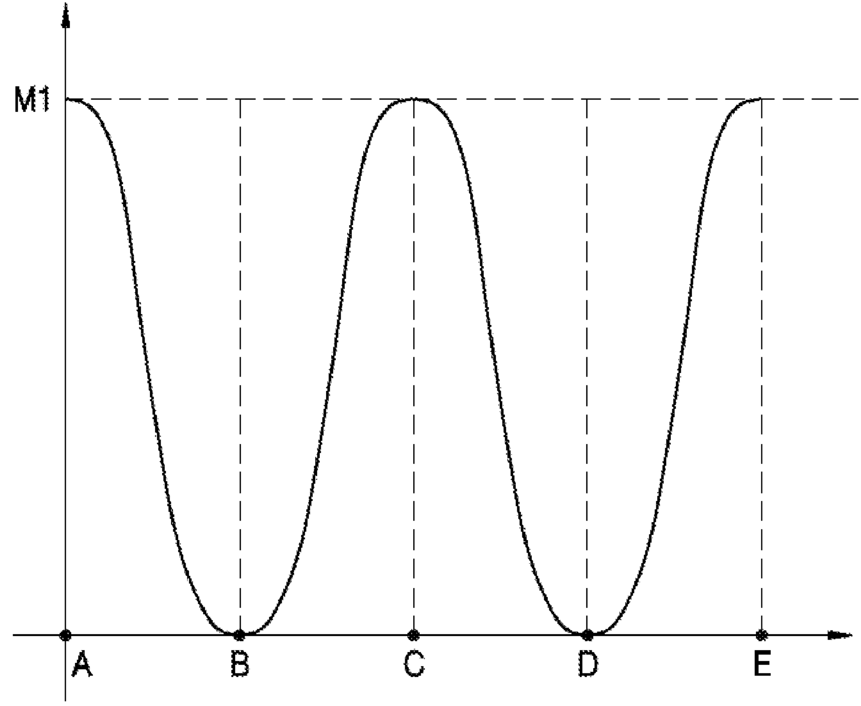
FIG. 5 is a graph showing external force applied to a mask sheet in a third direction, according to an embodiment.

FIG. 5 is a graph showing external force applied to a mask sheet in a third direction, according to an embodiment.

In FIG. 5, the horizontal axis represents the position of the mask sheet 24, and the vertical axis represents external force applied to the mask sheet 24 in the third direction (e.g., the +z axis direction).

For example, in FIGS. 5, A, B, C, D, and E indicated on the horizontal axis may correspond to positions A, B, C, D, and E of the mask sheet 24 in FIG. 4.

Referring to FIGS. 4 and 5, external force acting on the first portion AR1 in the third direction (e.g., the +z axis direction) may be greater than external force acting on the second portion AR2 in the third direction (e.g., the +z axis direction).

For example, the magnitude of the external force acting on the positions A, C, and E, which correspond to the center of the first portion AR1, in the third direction (e.g., +z axis direction) may be M1, which is the largest. Also, the magnitude of the external force acting on the positions B and D, which correspond to the center of the second portion AR2, in the third direction (e.g., +z axis direction) may be 0, which is the smallest. Accordingly, the shape of the graph shown in FIG. 5 may have a cosine shape.

Figure 6:
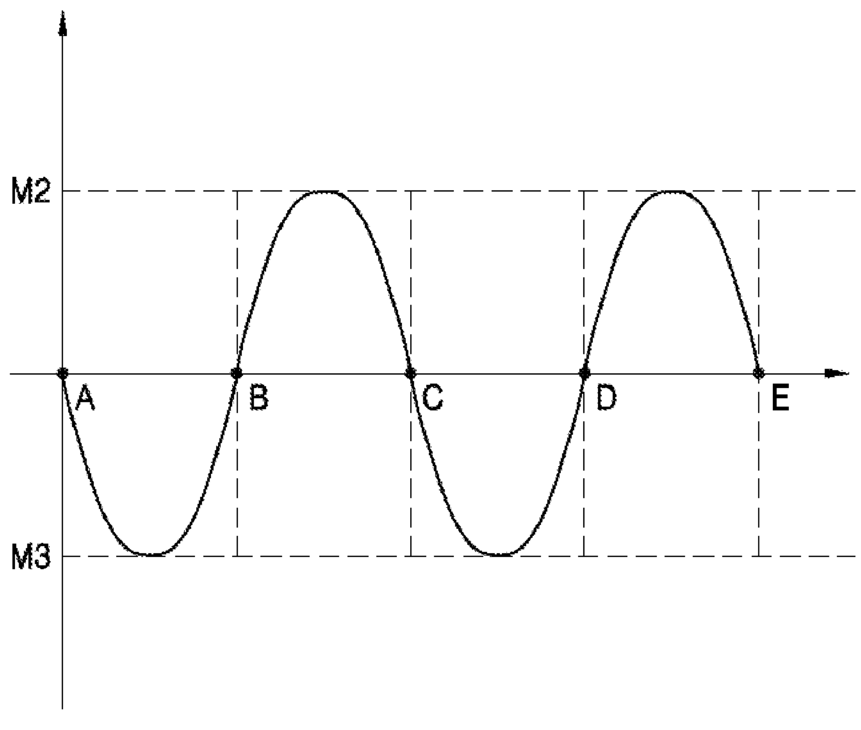
FIG. 6 is a graph showing external force applied to a mask sheet in a second direction, according to an embodiment.

FIG. 6 is a graph showing external force applied to a mask sheet in a second direction, according to an embodiment.

In FIG. 6, the horizontal axis represents the position of the mask sheet 24, and the vertical axis represents external force applied to the mask sheet 24 in the second direction (e.g., the +y axis direction).

For example, in FIGS. 6, A, B, C, D, and E indicated on the horizontal axis may correspond to positions A, B, C, D, and E of the mask sheet 24 in FIG. 4.

Referring to FIGS. 4 and 6, as a wave is formed in the mask sheet 24, external force acting on the mask sheet 24 in the second direction (e.g., the y axis direction) may be formed.

For example, at the positions A, C, and E, in which the magnitude of the external force acting in the third direction (e.g., +z axis direction) is M1, and the positions B and D, in which the magnitude of the external force acting in the third direction (e.g., +z axis direction) is 0, the magnitude of the external force acting in the second direction (e.g., +y axis direction) may be 0. Also, the magnitude of the external force acting in the second direction (e.g., the +y axis direction) may be the greatest between positions A and B, between positions B and C, between positions C and D, and between positions D and E. In FIGS. 6, M2 and M3 may have a same magnitude but may be in opposite directions. For example, absolute values of M2 and M3 may be the same. Accordingly, the shape of the graph shown in FIG. 6 may have a sine shape.

Figure 7:
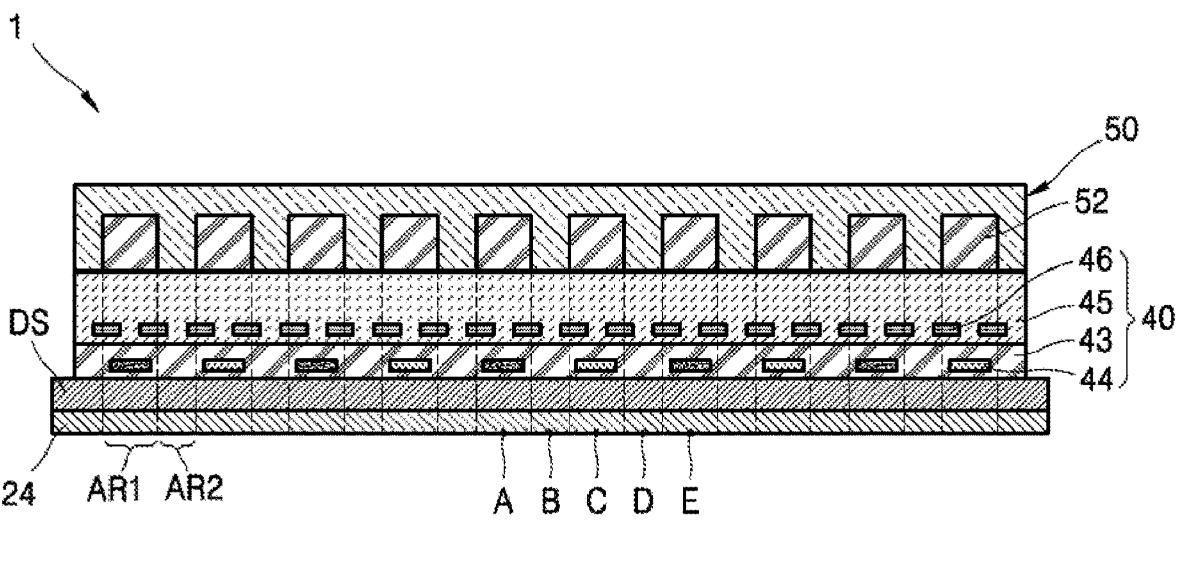
FIGS. 7 and 8 are schematic cross-sectional views of a portion of an apparatus for manufacturing a display device according to another embodiment.
Figure 7:
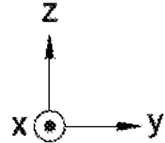
Figure 8:
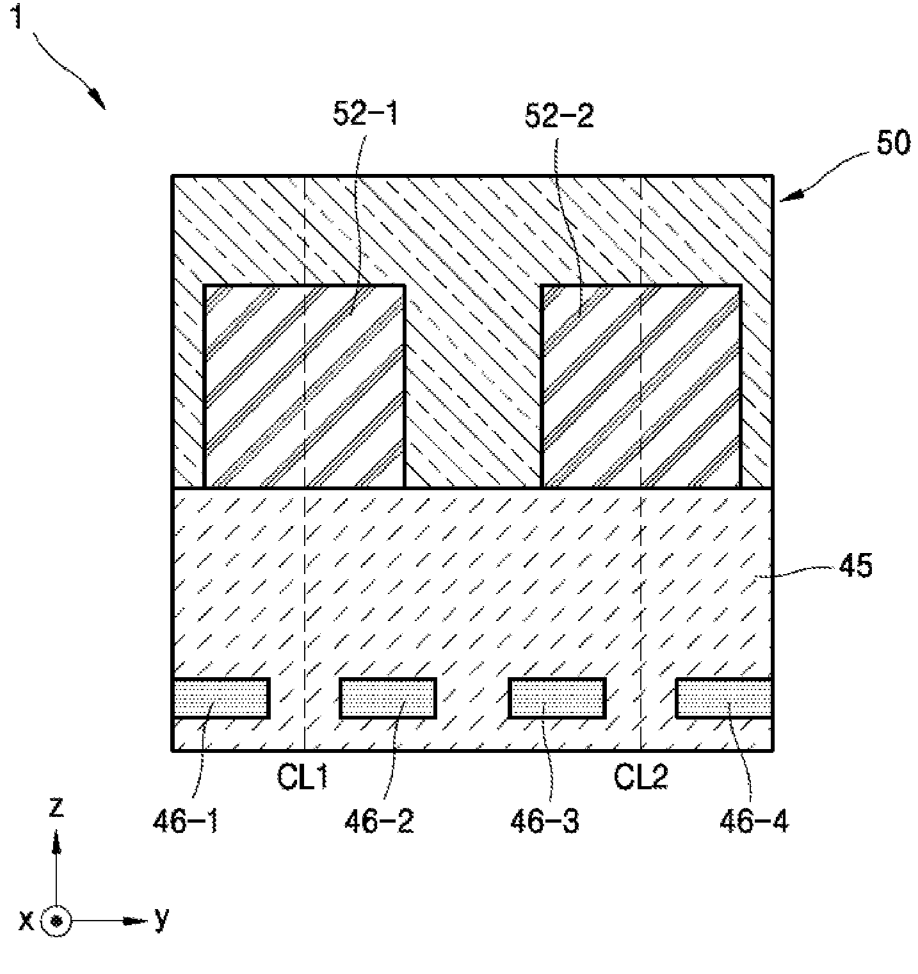

FIGS. 7 and 8 are schematic cross-sectional views of a portion of an apparatus for manufacturing a display device according to another embodiment. FIG. 8 is an enlarged view of a portion shown in FIG. 7.

For convenience of description, FIG. 7 shows only the mask sheet 24, the display substrate DS, the electrostatic chuck 40, and the magnetic force unit 50.

In FIGS. 7 and 8, the same reference numerals as those in FIG. 4 refer to the same members, and redundant descriptions thereof are omitted.

Referring to FIGS. 7 and 8, the electrostatic chuck 40 may further include multiple magnetic members 46. The magnetic members 46 may be arranged in the second electrostatic layer 45. For example, the magnetic members 46 may be arranged inside the second electrostatic layer 45. The magnetic members 46 may extend in the first direction (e.g., the x axis direction), and may be arranged to be spaced apart from each other in the second direction (e.g., the y axis direction). For example, the magnetic members 46 may be arranged to be parallel to each other.

Each of the magnetic members 46 may have a side overlapping at least one of the magnet units 52 and another side overlapping an opening between two adjacent magnet units 52 in a plan view. In a cross-sectional view, each of the magnetic members 46 may be arranged to be spaced apart from the center lines of the magnet units 52. The magnetic members 46 may be arranged to be spaced apart from the first electrostatic layer 43.

For example, the magnet units 52 may include a first magnet unit 52-1 and a second magnet unit 52-2, and the magnetic members 46 may include a first magnetic member 46-1, a second magnetic member 46-2, a third magnetic member 46-3, and a fourth magnetic member 46-4. The first magnetic member 46-1, the second magnetic member 46-2, the third magnetic member 46-3, and the fourth magnetic member 46-4 may be arranged in the second electrostatic layer 45.

Each of the first magnetic member 46-1, the second magnetic member 46-2, the third magnetic member 46-3, and the fourth magnetic member 46-4 may extend in the first direction (e.g., the x axis direction), and may be arranged to be spaced apart from each other in the second direction (e.g., y axis direction). A side of each of the first magnetic member 46-1 and the second magnetic member 46-2 may overlap the first magnet unit 52-1 in a plan view. A side of each of the third magnetic member 46-3 and the fourth magnetic member 46-4 may overlap the second magnet unit 52-2 in a plan view. Another side of each of the second magnetic member 46-2 and the third magnetic member 46-3 may overlap an opening between the first magnet unit 52-1 and the second magnet unit 52-2 in a plan view.

In a cross-sectional view, each of the first magnetic member 46-1 and the second magnetic member 46-2 may be arranged to be spaced apart from a center line CL1 of the first magnet unit 52-1. Also, in a cross-sectional view, each of the third magnetic member 46-3 and the fourth magnetic member 46-4 may be arranged to be spaced apart from a center line CL2 of the second magnet unit 52-2. The first magnetic member 46-1, the second magnetic member 46-2, the third magnetic member 46-3, and the fourth magnetic member 46-4 may be arranged to be spaced apart from the first electrostatic layer 43.

The magnetic members 46 may affect magnetic force applied between the magnet units 52 and the mask sheet 24. The magnetic members 46 may reduce external force acting on the mask sheet 24 in the second direction (e.g., the y axis direction). For example, the another side of each of the second magnetic member 46-2 and the third magnetic member 46-3 may reduce external force acting on the mask sheet 24 in the second direction (e.g., the y axis direction). Accordingly, a phenomenon in which a wave is formed in the mask sheet 24 may be reduced, and manufacturing quality of a display device may be improved.

Figure 9:
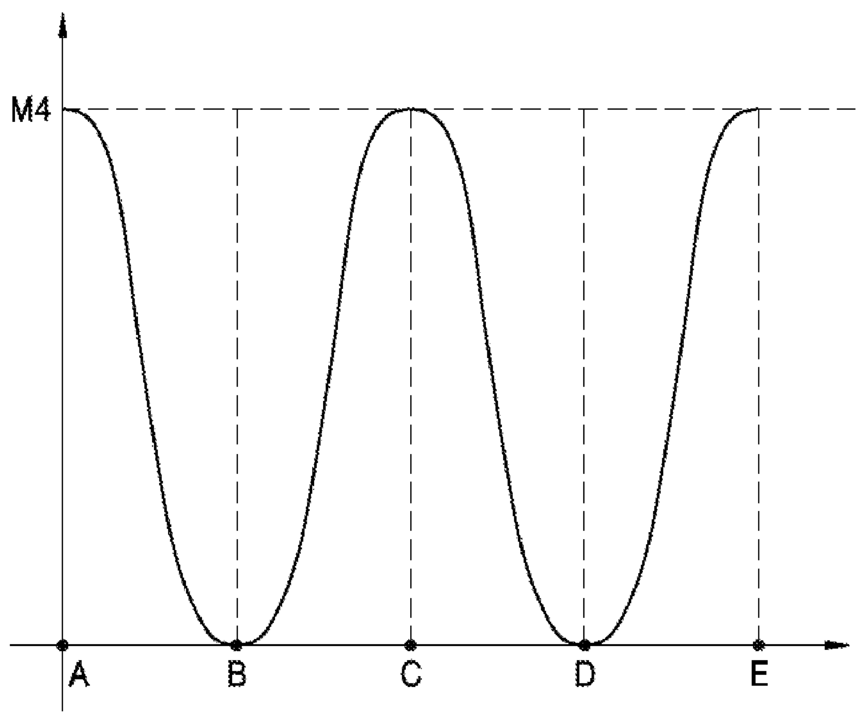
FIG. 9 is a graph showing external force applied to a mask sheet in a third direction, according to an embodiment.

FIG. 9 is a graph showing external force applied to a mask sheet in a third direction, according to an embodiment.

In FIG. 9, the horizontal axis represents the position of the mask sheet 24, and the vertical axis represents external force applied to the mask sheet 24 in the third direction (e.g., the +z axis direction).

For example, in FIGS. 9, A, B, C, D, and E indicated on the horizontal axis may correspond to positions A, B, C, D, and E of the mask sheet 24 in FIG. 7.

Referring to FIGS. 7 and 9, external force acting on the first portion AR1 in the third direction (e.g., the +z axis direction) may be greater than external force acting on the second portion AR2 in the third direction (e.g., the +z axis direction).

For example, the magnitude of the external force acting on the positions A, C, and E, which correspond to the center of the first portion AR1, in the third direction (e.g., +z axis direction) may be M4, which is the largest. Also, the magnitude of the external force acting on the positions B and D, which correspond to the center of the second portion AR2, in the third direction (e.g., +z axis direction) may be 0, which is the smallest. Accordingly, the shape of the graph shown in FIG. 9 may have a cosine shape.

As each of the magnetic members 46 is arranged to be spaced apart from the center lines of the magnet units 52, M4 in FIG. 9 may not be smaller than M1 in FIG. 5. Rather, M4 in FIG. 9 may be greater than M1 in FIG. 5 due to the influence of the magnetic members 46.

Figure 10:
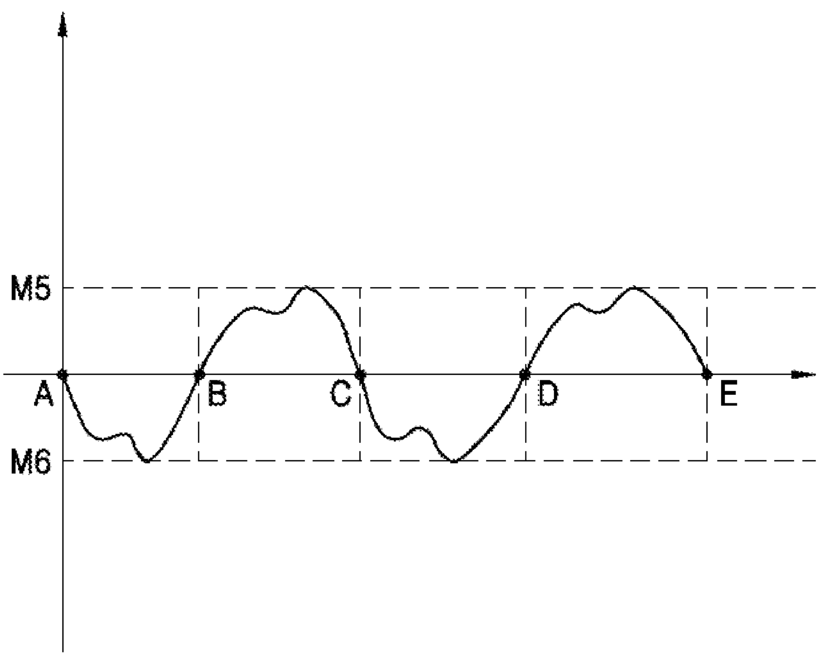
FIG. 10 is a graph showing external force applied to a mask sheet in a second direction, according to an embodiment.

FIG. 10 is a group showing external force applied to a mask sheet in a second direction, according to an embodiment.

In FIG. 10, the horizontal axis represents the position of the mask sheet 24, and the vertical axis represents external force applied to the mask sheet 24 in the second direction (e.g., the +y axis direction).

For example, in FIGS. 10, A, B, C, D, and E indicated on the horizontal axis may correspond to positions A, B, C, D, and E of the mask sheet 24 in FIG. 7.

Referring to FIGS. 7 and 10, as a wave is formed in the mask sheet 24, external force acting on the mask sheet 24 in the second direction (e.g., the y axis direction) may be formed.

For example, at the positions A, C, and E, in which the magnitude of the external force acting in the third direction (e.g., the +z axis direction) is M4, the magnitude of the external force acting in the second direction (e.g., the +y axis direction) may be 0. Also, at the positions B and D, in which the magnitude of the external force acting in the third direction (e.g., the +z axis direction) is 0, the magnitude of the external force acting in the second direction (e.g., the +y axis direction) may be 0. Also, the magnitude of the external force acting in the second direction (e.g., the +y axis direction) may be the greatest between positions A and B, between positions B and C, between positions C and D, and between positions D and E. In FIGS. 10, M5 and M6 may have a same magnitude but may be in opposite directions. For example, absolute values of M5 and M6 may be the same.

The magnitude of M5 and M6 in FIG. 10 may be smaller than the magnitude of M2 and M3 in FIG. 6 due to the influence of the magnetic members 46. Accordingly, as the external force acting on the mask sheet 24 in the second direction (e.g., the y axis direction) is reduced, a phenomenon in which a wave is formed in the mask sheet 24 may be reduced.

Figure 11:
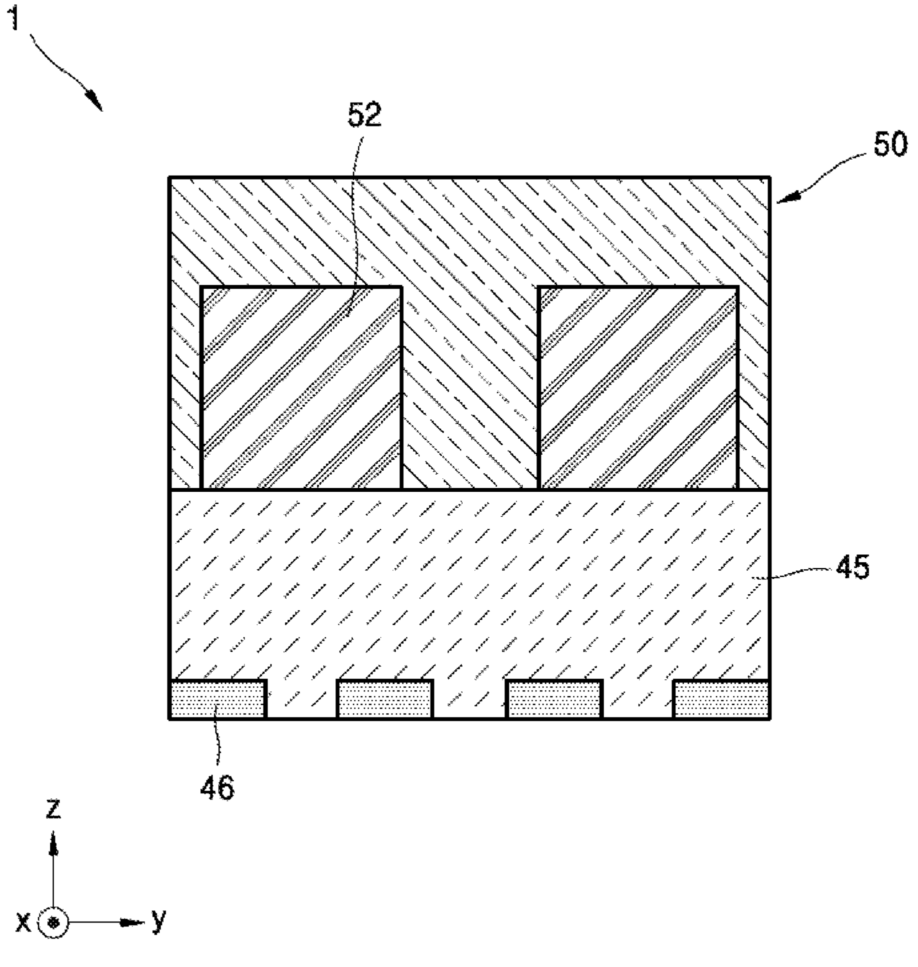
FIG. 11 is a schematic cross-sectional view of a portion of an apparatus for manufacturing a display device according to another embodiment.

FIG. 11 is a schematic cross-sectional view of a portion of an apparatus for manufacturing a display device according to another embodiment.

For convenience of description, FIG. 11 shows only the second electrostatic layer 45, the magnetic members 46, and the magnetic force unit 50 including the magnet units 52.

In FIG. 11, the same reference numerals as those in FIG. 8 refer to the same members, and redundant descriptions thereof are omitted.

The magnetic members 46 may be arranged to be in contact with the first electrostatic layer 43 (refer to FIG. 7). Lower surfaces of the magnetic members 46 may be exposed from the second electrostatic layer 45. The magnetic members 46 may be sealed by the first electrostatic layer 43 (refer to FIG. 7) and the second electrostatic layer 45. However, the arrangement of the magnetic members 46 described in FIG. 11 is not limited thereto, and the arrangement of the magnetic members 46 may vary.

Figure 12:
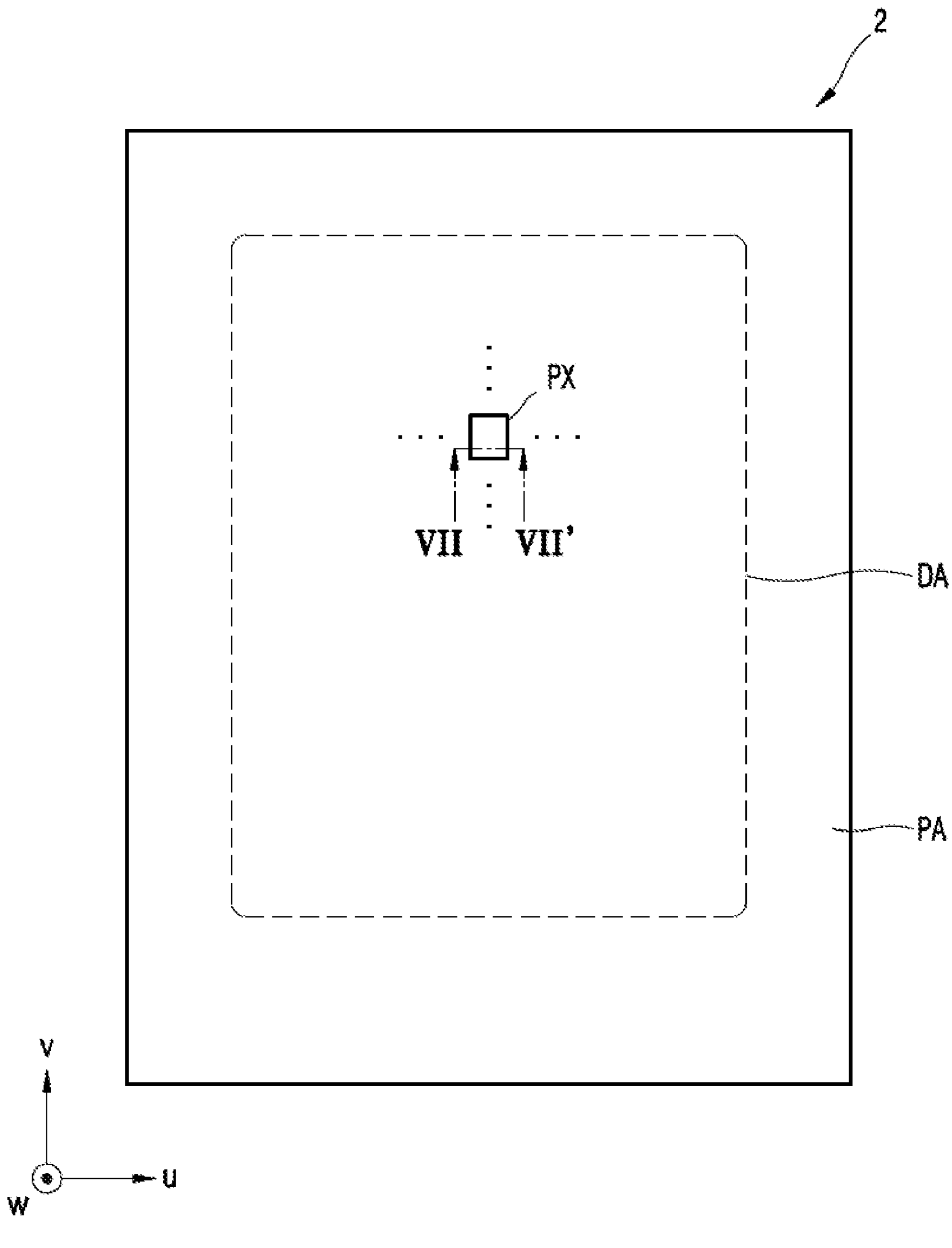
FIG. 12 is a plan view schematically illustrating a display device according to an embodiment.

FIG. 12 is a plan view schematically illustrating a display device according to an embodiment.

Referring to FIG. 12, a display device 2 manufactured according to an embodiment may include a display area DA and a peripheral area PA adjacent to the display area DA. The display device 2 may provide an image through an array of multiple pixels PX, which are two-dimensionally arranged in the display area DA.

The peripheral area PA may be an area which does not provide an image, and may entirely or partially surround the display area DA. A driver configured to provide electrical signals or power to a pixel circuit corresponding to each of the pixels PX or the like may be arranged in the peripheral area PA. A pad, which is an area to which an electronic device or a printed circuit board may be electrically connected, may be arranged in the peripheral area PA.

Hereinafter, although the display device 2 is described as including an organic light-emitting diode (OLED) as a light-emitting element, the display device 2 is not limited thereto. In another embodiment, the display device 2 may be a light-emitting display device including an inorganic light-emitting diode, for example, an inorganic light-emitting display device. The inorganic light-emitting diode may include a PN junction diode including materials based on inorganic semiconductors. In case that a voltage is applied to the PN junction diode in a forward direction, holes and electrons may be injected, and energy generated by recombination of the holes and electrons may be converted into light energy to emit a color of light. The inorganic light-emitting diode described above may have a width of several micrometers to several hundreds of micrometers, and in embodiments, the inorganic light-emitting diode may be a micro light-emitting diode (LED). In another embodiment, the display device 2 may be a quantum dot light-emitting display device.

The display device 2 may be a portable electronic device, such as a mobile phone, a smartphone, a table personal computer (PC), a mobile communication terminal, an electronic notebook, an electronic book, a portable multimedia player (PMP), a navigation device, an Ultra Mobile PC (UMPC), or the like, and may also be used as a display screen of various products, such as a television, a laptop computer, a monitor, an advertisement board, an Internet of things (IoT) device, or the like. The display device 2 according to an embodiment may be used as a wearable device, such as a smart watch, a watch phone, a glasses-type display, and a head-mounted display (HMD). Also, the display device 2 according to an embodiment may be applied to a dashboard of a vehicle, a center fascia of a vehicle, a center information display (CID) disposed on a dashboard, a rear-view mirror display replacing a side mirror of a vehicle, and a display screen disposed on a back surface of a front seat as entertainment for a passenger in a back seat of a vehicle.

Figure 13:
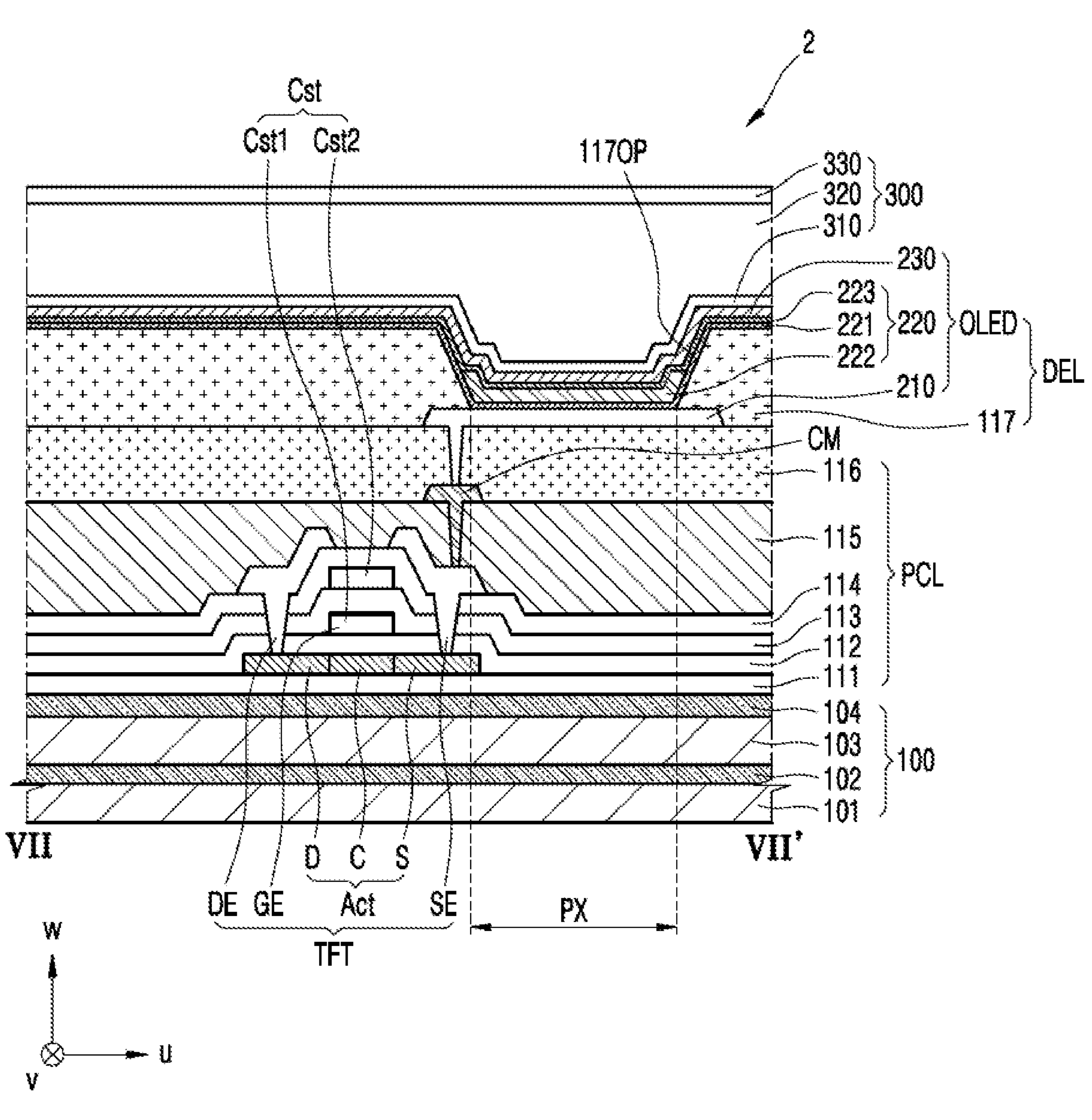
FIG. 13 is a schematic cross-sectional view schematically illustrating a display device according to an embodiment.

FIG. 13 is a schematic cross-sectional view schematically illustrating a display device according to an embodiment, taken along line VII-VII' of FIG. 12.

Referring to FIG. 13, the display device 2 may include a stacked structure of a substrate 100, a pixel circuit layer PCL, a display element layer DEL, and an encapsulation layer 300.

The substrate 100 may have a multi-layered structure including a base layer and an inorganic layer, the base layer including a polymer resin. For example, the substrate 100 may include a base layer including a polymer resin, and a barrier layer of an inorganic insulating layer. For example, the substrate 100 may include a first base layer 101, a first barrier layer 102, a second base layer 103, and a second barrier layer 104, which are sequentially stacked. The first base layer 101 and the second base layer 103 may each include polyimide (PI), polyethersulfone (PES), polyarylate, polyetherimide (PEI), polyethylene naphthalate (PEN), polyethylene terephthalate (PET), polyphenylene sulfide (PPS), polycarbonate, cellulose triacetate (TAC), cellulose acetate propionate (CAP), and/or the like. The first barrier layer 102 and the second barrier layer 104 may each include an inorganic insulating material, such as silicon oxide, silicon nitride, and/or silicon oxynitride. The substrate 100 may be flexible.

The pixel circuit layer PCL may be disposed on the substrate 100. FIG. 13 shows that the pixel circuit layer PCL includes a thin-film transistor TFT, a buffer layer 111, a first gate insulating layer 112, a second gate insulating layer 113, an interlayer insulating layer 114, a first planarization insulating layer 115, and a second planarization insulating layer 116, and that the buffer layer 111, the first gate insulating layer 112, the second gate insulating layer 113, the interlayer insulating layer 114, the first planarization insulating layer 115, and the second planarization insulating layer 116 are disposed below or/and above components of the thin-film transistor TFT.

The buffer layer 111 may reduce or block penetration of foreign materials, moisture, or external air from a lower portion of the substrate 100 and may provide a flat surface on the substrate 100. The buffer layer 111 may include an inorganic insulating material, such as silicon oxide, silicon oxynitride, and silicon nitride, and may have a single-layered structure or a multi-layered structure, each including the material stated above.

The thin-film transistor TFT disposed on the buffer layer 111 may include a semiconductor layer Act, and the semiconductor layer Act may include polysilicon (poly-Si). In another embodiment, the semiconductor layer Act may include amorphous silicon (a-Si), an oxide semiconductor, an organic semiconductor, or the like. The semiconductor layer Act may include a channel area C, a drain area D, and a source area S, and the drain area D and the source area S may be respectively arranged on a side of the channel area C. A gate electrode GE of the thin-film transistor TFT may overlap the channel area C in a plan view.

The gate electrode GE may include a low-resistance metal material. The gate electrode GE may include a conductive material including molybdenum (Mo), aluminum (Al), copper (Cu), titanium (Ti), or the like, and may have a multi-layer or a single layer, each including the material stated above.

The first gate insulating layer 112 between the semiconductor layer Act and the gate electrode GE may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. The zinc oxide ($ZnO_x$) may be zinc oxide (ZnO) or zinc peroxide ($ZnO_2$).

The second gate insulating layer 113 may cover the gate electrode GE. Similar to the first gate insulating layer 112, the second gate insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. The zinc oxide ($ZnO_X$) may be zinc oxide (ZnO) or zinc peroxide ($ZnO_2$).

An upper electrode Cst2 of a storage capacitor Cst may be disposed on the second gate insulating layer 113. The upper electrode Cst2 may overlap the gate electrode GE in a plan view. The gate electrode GE and the upper electrode Cst2, which overlap each other with the second gate insulating layer 113 between the gate electrode GE and the upper electrode Cst2, may form a storage capacitor Cst. For example, the gate electrode GE may function as a lower electrode Cst1 of the storage capacitor Cst.

As such, the storage capacitor Cst and the thin-film transistor TFT may overlap with each other in a plan view. In embodiments, the storage capacitor Cst may not overlap the thin-film transistor TFT in a plan view.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), Cu, or a combination thereof and may have a single layer or a multi-layer, each including the material stated above.

The interlayer insulating layer 114 may cover the upper electrode Cst2. The interlayer insulating layer 114 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. The zinc oxide ($ZnO_X$) may be zinc oxide (ZnO) or zinc peroxide ($ZnO_2$). The interlayer insulating layer 114 may have a single layer or a multi-layer, each including the inorganic insulating material stated above.

Each of a drain electrode DE and a source electrode SE of the thin-film transistor TFT may be disposed on the interlayer insulating layer 114. The drain electrode DE and the source electrode SE may respectively be connected to the drain area D and the source area S through contact holes formed in insulating layers below the drain electrode DE and the source electrode SE. The drain electrode DE and the source electrode SE may each include a material having good conductivity. The drain electrode DE and the source electrode SE may each include a conductive material such as Mo, Al, Cu, Ti, or the like, and may have a multi-layer or a single layer, each including the above material. In an embodiment, the drain electrode DE and the source electrode SE may each have a multi-layered structure of Ti/Al/Ti.

The first planarization insulating layer 115 may cover the drain electrode DE and the source electrode SE. The first planarization insulating layer 115 may include a general commercial polymer, such as poly(methyl methacrylate) (PMMA) or polystyrene (PS), a polymer derivative having a phenol group, and an organic insulating material, such as an acrylic polymer, an imide polymer, an aryl ether polymer, an amide polymer, a fluorine polymer, a p-xylene polymer, a vinyl alcohol polymer, and a mixture thereof.

The second planarization insulating layer 116 may be disposed on the first planarization insulating layer 115. The second planarization insulating layer 116 and the first planarization insulating layer 115 may include a same material, and the second planarization insulating layer 116 may include a general commercial polymer, such as PMMA or PS, a polymer derivative having a phenol group, and an organic insulating material, such as an acrylic polymer, an imide polymer, an aryl ether polymer, an amide polymer, a fluorine polymer, a p-xylene polymer, a vinyl alcohol polymer, and a mixture thereof.

The display element layer DEL may be disposed on the pixel circuit layer PCL having the structure described above. The display element layer DEL may include an organic light-emitting diode OLED as a display element (for example, a light-emitting element), and the organic light-emitting diode OLED may include a stacked structure of a pixel electrode 210, an intermediate layer 220, and a common electrode 230. The organic light-emitting diode OLED may emit, for example, red, green, or blue light, or may emit red, green, blue, or white light. The organic light-emitting diode OLED may emit light through an emission area, and define the emission area as a pixel PX.

The pixel electrode 210 of the organic light-emitting diode OLED may be electrically connected to the thin-film transistor TFT through a contact hole formed in the second planarization insulating layer 116 and the first planarization insulating layer 115 and a contact metal CM disposed on the first planarization insulating layer 115.

The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective film including Ag, Mg, Al, Pt, Pd, Au, Ni, Nd, Ir, Cr, or a compound thereof. In another embodiment, the pixel electrode 210 may further include a film including ITO, IZO, ZnO, or $In_2O_3$ above/below the reflective film described above.

A bank layer 117 having an opening 117OP exposing a central portion of the pixel electrode 210 may be disposed on the pixel electrode 210. The bank layer 117 may include an organic insulating material and/or an inorganic insulating material. The opening 117OP may define an emission area that emits light from the organic light-emitting diode OLED. For example, the size/width of the opening 117OP may correspond to the size/width of the emission area. Accordingly, the size and/or width of the pixel PX may depend on the size and/or width of the opening 117OP of the bank layer 117.

The intermediate layer 220 may include an emission layer 222 formed corresponding to the pixel electrode 210. The emission layer 222 may include a polymer organic material or a low-molecular-weight organic material, which emits light of a color. In another embodiment, the emission layer 222 may include an inorganic light-emitting material or a quantum dot.

In an embodiment, the intermediate layer 220 may include a first functional layer 221 and a second functional layer 223 respectively disposed below and on the emission layer 222. The first functional layer 221 may include a hole transport layer (HTL), or an HTL and a hole injection layer (HIL). The second functional layer 223 may be a component disposed on the emission layer 222, and may include an electron transport layer ETL and/or an electron injection layer (EIL). Similar to the common electrode 230 described below, the first functional layer 221 and/or the second functional layer 223 may be a common layer entirely covering the substrate 100.

The common electrode 230 may be disposed above the pixel electrode 210 and overlap the pixel electrode 210 in a plan view. The common electrode 230 may include a conductive material having a low work function. For example, the common electrode 230 may include a (semi)transparent layer including Ag, Mg, Al, Pt, Pd, Au, Ni, Nd, Ir, Cr, lithium (Li), Ca, an alloy thereof, or the like. In another embodiment, the common electrode 230 may further include a layer, such as ITO, IZO, ZnO, or $In_2O_3$, above the (semi)transparent layer including the materials stated above. The common electrode 230 may be integrally formed to entirely cover the substrate 100.

The encapsulation layer 300 may be disposed on the display element layer DEL and cover the display element layer DEL. The encapsulation layer 300 may include at least one inorganic encapsulation layer and at least one organic encapsulation layer, and in an embodiment, as shown in FIG. 13, the encapsulation layer 300 may include a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may each include at least one inorganic material such as aluminum oxide, titanium oxide, tantalum oxide, hafnium oxide, zinc oxide, silicon oxide, silicon nitride, and silicon oxynitride. The organic encapsulation layer 320 may include a polymer-based material. In an embodiment, the organic encapsulation layer 320 may include an acrylic resin, an epoxy resin, polyimide, polyethylene, or the like. In an embodiment, the organic encapsulation layer 320 may include acrylate. The organic encapsulation layer 320 may be formed by curing a monomer or coating a polymer. The organic encapsulation layer 320 may have transparency.

Although not shown in FIG. 13, a touch sensor layer may be disposed on the encapsulation layer 300, and an optical functional layer may be disposed on the touch sensor layer.

The touch sensor layer may obtain coordinate information according to an external input, for example, a touch event. The optical functional layer may reduce the reflectance of light (external light) incident from the outside toward the display device, and/or improve color purity of light emitted by the display device. In an embodiment, the optical functional layer may include a retarder and/or a polarizer. The retarder may be a film type or a liquid-crystal coating type, and may include a λ/2 retarder and/or a λ/4 retarder. The polarizer may also be a film type or a liquid-crystal coating type. The film-type polarizer may include a stretch-type synthetic resin film, and the liquid-crystal-coating-type polarizer may include liquid crystals in an arrangement. The retarder and the polarizer may further include a protective film.

An adhesive member may be arranged between the touch sensor layer and the optical functional layer. As the adhesive member, a general adhesive member may be employed without limitation. The adhesive member may be a pressure sensitive adhesive (PSA).

Figure 14:
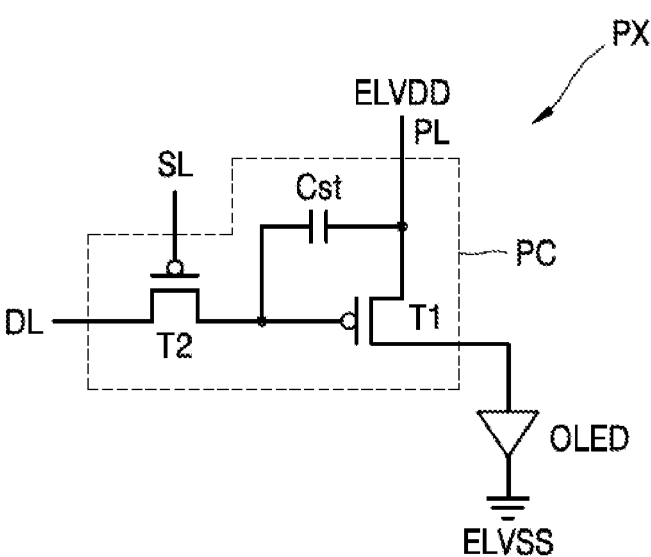
FIG. 14 is a schematic diagram of an equivalent circuit of a pixel of a display panel according to an embodiment.

FIG. 14 is a schematic diagram of an equivalent circuit of a pixel of a display panel according to an embodiment.

Each pixel PC may include a pixel circuit PC and a display element connected to the pixel circuit PC, for example, an organic light-emitting diode OLED. The pixel circuit PC may include a first thin-film transistor T1, a second thin-film transistor T2, and a storage capacitor Cst. Each pixel PX may emit, for example, red, green, blue, or white light through the organic light-emitting diode OLED.

The second thin-film transistor T2 may be a switching thin-film transistor, which may be connected to a scan line SL and the data line DL and be configured to transfer, to the first thin-film transistor T1, a data voltage input from the data line DL based on a switching voltage input from the scan line SL. The storage capacitor Cst may be connected to the second thin-film transistor T2 and a driving voltage line PL and store a voltage corresponding to a difference between a voltage received from the second thin-film transistor T2 and a first power supply voltage ELVDD supplied from the driving voltage line PL.

The first thin-film transistor T1 may be a driving thin-film transistor, which may be connected to the driving voltage line PL and the storage capacitor Cst and control a driving current flowing from the driving voltage line PL to the organic light-emitting diode OLED, in accordance with a voltage value stored in the storage capacitor Cst. The organic light-emitting diode OLED may emit light having a brightness according to the driving current. An opposite electrode (e.g., a cathode) of the organic light-emitting diode OLED may receive a second power supply voltage ELVSS.

FIG. 14 illustrates that the pixel circuit PC includes two thin-film transistors and one storage capacitor, but the disclosure is not limited thereto. The number of thin-film transistors and the number of storage capacitors may be variously changed according to the design of the pixel circuit PC. For example, the pixel circuit PC may include four or more thin-film transistors in addition to the above-mentioned two thin-film transistors.

According to embodiments, a phenomenon in which a wave is formed in a mask sheet may be reduced.

Effects of the disclosure are not limited to the effects mentioned above, and other effects not mentioned will be clearly understood by one of ordinary in the art from the description of the claims.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An apparatus for manufacturing a display device, the apparatus comprising:

a chamber;

a mask assembly arranged inside the chamber and facing a display substrate;

an electrostatic chuck arranged inside the chamber, making the display substrate to be in close contact with the mask assembly, and comprising a plurality of magnetic members; and a magnetic force unit arranged inside the chamber and comprising a plurality of magnet units that apply magnetic force to the mask assembly, wherein each of the plurality of magnet units extends in a first direction and are arranged to be spaced apart from each other in a second direction intersecting the first direction, and each of the plurality of magnetic members has a side overlapping at least one of the plurality of magnet units and another side overlapping an opening between two adjacent ones of the plurality of magnet units in a plan view.

2. The apparatus of claim 1, wherein, in a cross-sectional view, each of the plurality of magnetic members is arranged to be spaced apart from a center line of each of the plurality of magnet units, and the center line of each of the plurality of magnet units is based on the second direction.

3. The apparatus of claim 1, wherein the electrostatic chuck further comprises:

a first electrostatic layer comprising an insulating material;

an electrostatic electrode arranged in the first electrostatic layer and comprising a plurality of positive electrodes and a plurality of negative electrodes; and a second electrostatic layer disposed on the first electrostatic layer, and the plurality of magnetic members are arranged in the second electrostatic layer.

4. The apparatus of claim 3, wherein the plurality of magnetic members are arranged to be spaced apart from the first electrostatic layer.

5. The apparatus of claim 3, wherein the plurality of magnetic members contact the first electrostatic layer.

6. The apparatus of claim 3, wherein a thickness of the second electrostatic layer is greater than a thickness of the first electrostatic layer in a thickness direction of the magnetic force unit.

7. The apparatus of claim 6, wherein the second electrostatic layer comprises at least one of ceramic, aluminum, titanium, stainless steel, and yttrium oxide.

8. The apparatus of claim 1, wherein the mask assembly comprises:

a mask frame including a mask opening; and a plurality of mask sheets fixed to the mask frame and overlapping the mask opening in a plan view.

9. The apparatus of claim 8, wherein each of the plurality of mask sheets extends in the second direction.

10. The apparatus of claim 1, wherein each of the plurality of magnetic members extends in the first direction.

11. An apparatus for manufacturing a display device, the apparatus comprising:

a mask assembly arranged inside a chamber and facing a display substrate;

an electrostatic chuck arranged inside the chamber and making the display substrate to be in close contact with the mask assembly; and a magnetic force unit arranged inside the chamber and comprising a first magnet unit and a second magnet unit that apply magnetic force to the mask assembly, wherein the electrostatic chuck comprises a first magnetic member, a second magnetic member, a third magnetic member, and a fourth magnetic member each extending in a first direction and arranged to be spaced apart from each other in a second direction intersecting the first direction, a side of each of the first magnetic member and the second magnetic member overlaps the first magnet unit in a plan view, a side of each of the third magnetic member and the fourth magnetic member overlaps the second magnet unit in a plan view, and another side of each of the second magnetic member and the third magnetic member overlaps an opening between the first magnet unit and the second magnet unit in a plan view.

12. The apparatus of claim 11, wherein, in a cross-sectional view, each of the first magnetic member and the second magnetic member is arranged to be spaced apart from a center line of the first magnet unit, each of the third magnetic member and the fourth magnetic member is arranged to be spaced apart from a center line of the second magnet unit, and the center line of the first magnet unit and the center line of the second magnet unit are based on the second direction.

13. The apparatus of claim 11, wherein the electrostatic chuck further comprises:

a first electrostatic layer comprising an insulating material;

an electrostatic electrode arranged in the first electrostatic layer and comprising a plurality of positive electrodes and a plurality of negative electrodes; and a second electrostatic layer disposed on the first electrostatic layer, and the first magnetic member, the second magnet member, the third magnetic member, and the fourth magnetic member are arranged in the second electrostatic layer.

14. The apparatus of claim 13, wherein the first magnetic member, the second magnetic member, the third magnetic member, and the fourth magnetic member are arranged to be spaced apart from the first electrostatic layer.

15. The apparatus of claim 13, wherein the first magnetic member, the second magnetic member, the third magnetic member, and the fourth magnetic member contact the first electrostatic layer.

16. The apparatus of claim 13, wherein a thickness of the second electrostatic layer is greater than a thickness of the first electrostatic layer in a thickness direction of the magnetic force unit.

17. The apparatus of claim 16, wherein the second electrostatic layer comprises at least one of ceramic, aluminum, titanium, stainless steel, and yttrium oxide.

18. The apparatus of claim 11, wherein the mask assembly comprises:

a mask frame including a mask opening; and a plurality of mask sheets fixed to the mask frame and overlapping the mask opening in a plan view.

19. The apparatus of claim 18, wherein each of the plurality of mask sheets extends in the second direction.

20. The apparatus of claim 11, further comprising:

a deposition source arranged inside the chamber and accommodating a deposition material.

* * * * *